(12) United States Patent
Cheng et al.

(10) Patent No.: US 9,564,571 B2
(45) Date of Patent: Feb. 7, 2017

(54) ELECTRONIC DEVICE HAVING THERMOELECTRIC CONVERSION MODULE

(71) Applicant: Wistron Corporation, New Taipei (TW)

(72) Inventors: Ting-Yao Cheng, New Taipei (TW); Ya-Shian Huang, New Taipei (TW); Chen-Pu Yang, New Taipei (TW); Ming-Te Lee, New Taipei (TW)

(73) Assignee: Wistron Corporation, New Taipei (TW)

( * ) Notice: Subject to any disclaimer, the term of this patent is extended or adjusted under 35 U.S.C. 154(b) by 231 days.

(21) Appl. No.: 14/630,657

(22) Filed: Feb. 25, 2015

(65) Prior Publication Data

US 2016/0149107 A1    May 26, 2016

(30) Foreign Application Priority Data

Nov. 24, 2014  (TW) .............................. 103140610 A

(51) Int. Cl.
| | |
|---|---|
| *H02J 7/00* | (2006.01) |
| *H02J 7/14* | (2006.01) |
| *H01L 35/32* | (2006.01) |
| *H02J 7/35* | (2006.01) |
| *H02J 7/02* | (2016.01) |

(52) U.S. Cl.
CPC ............. *H01L 35/32* (2013.01); *H02J 7/0044* (2013.01); *H02J 7/0052* (2013.01); *H02J 7/025* (2013.01); *H02J 7/35* (2013.01)

(58) Field of Classification Search
USPC ................ 320/101, 114, 137, 107, 103, 108, 115,320/116, 162, 112, 113; 136/200
See application file for complete search history.

(56) References Cited

U.S. PATENT DOCUMENTS

| | | | | |
|---|---|---|---|---|
| 7,782,610 | B2* | 8/2010 | Diebel | G06F 1/1628 361/679.41 |
| 8,051,980 | B2* | 11/2011 | Tai | H04M 1/185 206/320 |
| 2009/0014045 | A1* | 1/2009 | Hines | H01L 35/34 136/200 |
| 2013/0063873 | A1* | 3/2013 | Wodrich | G06F 1/1635 361/679.01 |

(Continued)

*Primary Examiner* — Alexis A Boateng
(74) *Attorney, Agent, or Firm* — Jianq Chyun IP Office

(57) ABSTRACT

An electronic device includes a main body and a thermoelectric conversion module. The main body has a heat generating element therein. The thermoelectric conversion module includes a shell and a thermoelectric conversion element. The shell is assembled to the main body. The thermoelectric conversion element is pivoted on the shell and has an operation surface and a back surface opposite to each other. The thermoelectric conversion element is adapted to rotate between a first state and a second state relatively to the shell. When the thermoelectric conversion element is in the first state, the operation surface faces the main body and receives heat from the heat generating element, for the thermoelectric conversion element to generate electricity. When the thermoelectric conversion element is in the second state, the back surface faces the main body and the operation surface receives heat from external environment, for the thermoelectric conversion element to generate electricity.

17 Claims, 15 Drawing Sheets

(56) References Cited

U.S. PATENT DOCUMENTS

2013/0314030 A1* 11/2013 Fathollahi ............. H02J 7/0045
            320/107
2016/0294201 A1* 10/2016 Avital .................. H01R 31/065

* cited by examiner

ELECTRONIC DEVICE HAVING THERMOELECTRIC CONVERSION MODULE

CROSS-REFERENCE TO RELATED APPLICATION

This application claims the priority benefit of Taiwan application serial no. 103140610, filed on Nov. 24, 2014. The entirety of the above-mentioned patent application is hereby incorporated by reference herein and made a part of this specification.

BACKGROUND OF THE INVENTION

1. Field of the Invention

The invention relates to an electronic device, and relates particularly to an electronic device having a thermoelectric conversion module.

2. Description of Related Art

Benefiting from advances in semiconductor devices and display technology, electronic devices are continuing to be developed to be smaller and multifunctional as well as portably convenient. Commonly seen portable electronic devices include tablet PCs, smart phones, notebook computers and the like.

In terms of smart phones, the functions of smart phones are expanding day by day and may provide a user with information, multimedia, document, gaming, navigation, internet surfing and such services, however consequently due to the operation of these services the power consumption increases greatly, and lowers the endurance of a smart phone. In current designs of smart phones, battery capacity is increased or set to power saving mode to improve the problem of large power consumption, however the thin design trend of smart phones limits the housing space of batteries, and setting the smart phone to power saving mode lowers the brightness of the screen and closing partial phone functions results in inconvenience to the user. In addition, although using a portable power source to charge a smart phone is a solution to the above problem, however carrying an extra power source is an inconvenience for the user.

SUMMARY OF THE INVENTION

The invention provides an electronic device, having better endurance.

The electronic device of the invention includes a main body and a thermoelectric conversion module. The main body has at least one heat generating element therein. The thermoelectric conversion module includes a shell and a thermoelectric conversion element. The shell is assembled to the main body. The thermoelectric conversion element is pivoted on the shell and has an operation surface and a back surface opposite to each other. The thermoelectric conversion element is adapted to rotate between a first state and a second state relative to the shell. When the thermoelectric conversion element is in the first state, the operation surface faces the main body and receives heat from the heat generating element, for the thermoelectric conversion element to generate electricity. When the thermoelectric conversion element is in the second state, the back surface faces the main body and the operation surface receives heat from the external environment, for the thermoelectric conversion element to generate electricity.

In an embodiment of the invention, the shell has an electrical connection portion, and the thermoelectric conversion element is electrically connected with the main body via the electrical connection portion, such that the electrical connection portion charges the main body.

In an embodiment of the invention, the shell has at least one axial hole, the thermoelectric conversion element has at least one shaft and is pivoted on the axial hole by the shaft, the axial hole has a stop structure therein, the shaft has a protruding portion, and the stop structure is adapted to stop the protruding portion to restrict a rotation range of the thermoelectric conversion element.

In an embodiment of the invention, the stop structure has a first stop surface and a second stop surface, when the thermoelectric conversion element rotates to the second state from the first state along a first rotation direction, the first stop surface stops the protruding portion to prevent the thermoelectric conversion element from continuing to rotate along the first rotation direction, and when the thermoelectric conversion element rotates to the first state from the second state along a second rotation direction opposite to the first rotation direction, the second stop surface stops the protruding portion to prevent the thermoelectric conversion element from continuing to rotate along the second rotation direction.

In an embodiment of the invention, the first stop surface and the second stop surface are coplanar.

In an embodiment of the invention, the shell has an accommodating opening, and when the thermoelectric conversion element is in the first state or the second state, the thermoelectric conversion element is accommodated in the accommodating opening.

In an embodiment of the invention, the shell has two axial holes opposite to each other, the thermoelectric conversion element has two shafts opposite to each other, and the two shafts are respectively pivoted at the two axial holes.

In an embodiment of the invention, the thermoelectric conversion module includes a pivoting component, the pivoting component is pivoted on the shell along a first axis, and the thermoelectric conversion element is pivoted on the pivoting component along a second axis.

In an embodiment of the invention, the thermoelectric conversion element is adapted to rotate relatively to the shell along the first axis via the pivoting component to expand or close the shell, and when the thermoelectric conversion element expands the shell, the thermoelectric conversion element is adapted to rotate relatively to the pivoting component along the second axis.

In an embodiment of the invention, the shell has two sliding grooves opposite to each other, and the thermoelectric conversion element has two shafts opposite to each other, and the two shafts are slidably disposed respectively at the two sliding grooves.

In an embodiment of the invention, the thermoelectric conversion element is adapted to rotate relatively to the shell via the two shafts to expand from or close to the shell, and when the thermoelectric conversion element expands from the shell, the thermoelectric conversion element is adapted to slide along each of the sliding grooves via each of the shafts.

In an embodiment of the invention, the thermoelectric conversion element has a connecting end and a free end opposite to each other, the connecting end is connected to the two sliding grooves by the two shafts, and the free end has a positioning structure and is adapted to be positioned at the shell by the positioning structure.

In an embodiment of the invention, when a temperatures of the operation surface sensed by the thermoelectric conversion module is higher than a predetermined temperature value, the thermoelectric conversion element generates electricity by a heat received by the operation surface, and when the temperature of the operation surface sensed by the thermoelectric conversion module is lower than the predetermined temperature value, the thermoelectric conversion element stops generating electricity.

In an embodiment of the invention, the main body has a first power storage unit, and when a power of the first power storage unit is not full, the thermoelectric conversion element charges the first power storage unit.

In an embodiment of the invention, the thermoelectric conversion module has a second power storage unit, and when the power of the first power storage unit is full, the thermoelectric conversion element stores electricity to the second power storage unit.

In an embodiment of the invention, the power of the first power storage unit is full and the power of the second power storage unit is full, the thermoelectric conversion element stops generating electricity.

In an embodiment of the invention, the main body has a casing, and the shell is a protection cover and detachably assembled to the casing.

Based on the above, the electronic device of the invention has a thermoelectric conversion module, and the thermoelectric conversion element of the thermoelectric conversion module may rotate relative to the shell, such that the operation surface of the thermoelectric conversion element faces towards the main body of the electronic device or faces towards the external environment. When an user operates the electronic device such that the heat generating element inside the main body of the electronic device generates heat, the operation surface of the thermoelectric conversion element may be faced towards the main body of the electronic device, to allow the heat generated by the heat generating element to be transmitted to the operation surface for the thermoelectric conversion element to perform thermoelectric conversion to generate electricity. On the other hand, when a user is not operating the electronic device, the operation surface of the thermoelectric conversion element may be faced towards the external environment, to allow the heat of the external environment (for example, heat generated by the body heat of a user or lighting) to be transmitted to the operation surface for the thermoelectric conversion element to perform thermoelectric conversion to produce electricity. Accordingly, the thermoelectric conversion module of the electronic device is able to perform thermoelectric conversion to generate electricity under the situations where a user is operating the electronic device and not operating the electronic device respectively, supplying electricity to the main body of the electronic device and enhancing the endurance of the electronic device.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
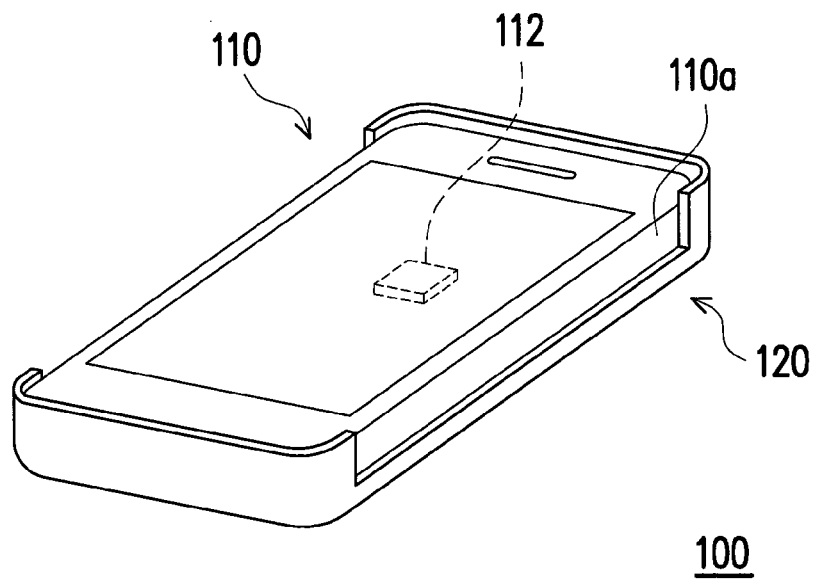
FIG. 1 is a three dimensional drawing illustrating an electronic device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
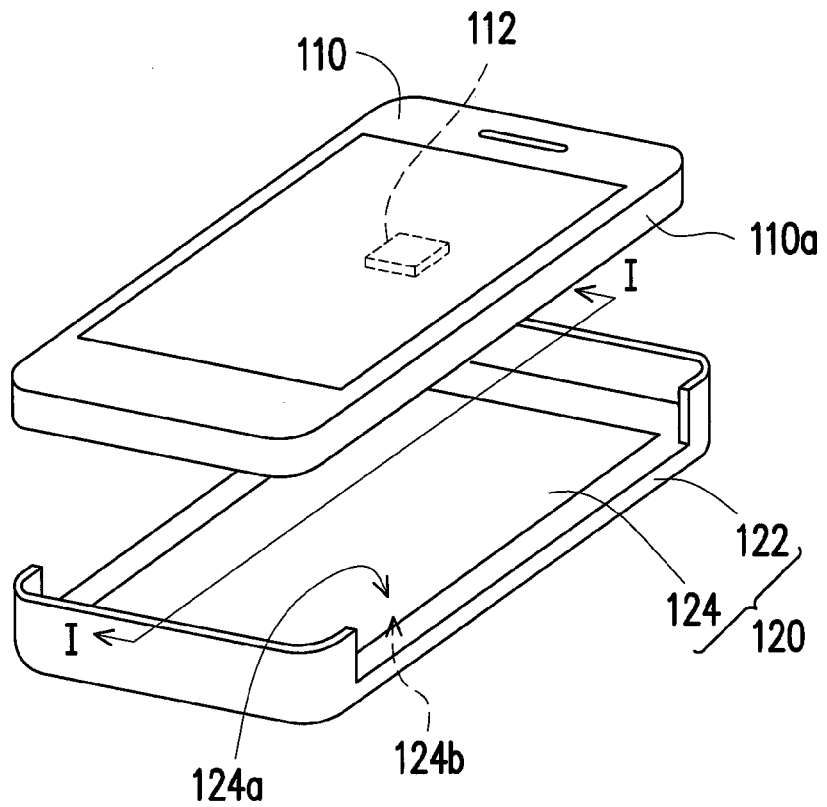
FIG. 2 illustrates the thermoelectric conversion module of FIG. 1 separated from the main body.

FIG. 1 is a three dimensional drawing illustrating an electronic device according to an embodiment of the invention. FIG. 2 illustrates the thermoelectric conversion module of FIG. 1 separated from the main body. Referring to FIG. 1 and FIG. 2, the electronic device 100 of the present embodiment includes a main body 110 and a thermoelectric conversion module 120. The main body 110, for example, is a smart phone which has at least one heat generating element 112 therein, and the heat generating element 112, for example, is a central processing unit (CPU) of the smart phone. In other embodiments, there may be a plurality of numbers of heat generating elements and also may be other types of electronic elements, and should not be construed as a limitation to the invention.

The thermoelectric conversion module 120 includes a shell 122 and a thermoelectric conversion element 124. The thermoelectric conversion element 124, for example, has a plate shape and is pivoted on the shell 122, and the thermoelectric conversion module 120 has an operation surface 124a and a back surface 124b opposite to each other. The operation surface 124a and the back surface 124b, for example, are respectively the hot side and the cold side of the thermoelectric conversion element 124, wherein the thermoelectric conversion element 124 uses the hot side of the thermoelectric conversion element 124 to receive heat, and using the temperature difference of the hot side and the cold side to generate electricity, based on known thermoelectric conversion technology which will not be described here. The shell 122, for example, is a protection cover suitable for a smart phone, and is detachably assembled to the casing 110a of the main body 110.

Figure 3A:
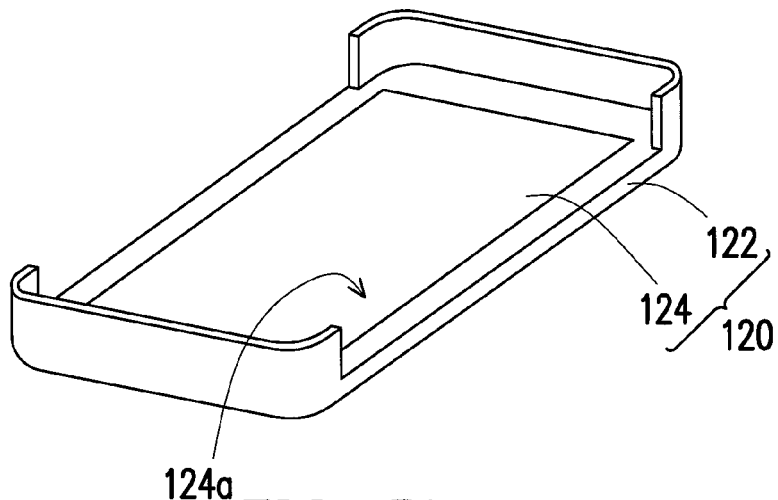
FIG. 3A to FIG. 3E illustrates a flow of an operation process of the thermoelectric conversion module of FIG. 1.
Figure 3B:
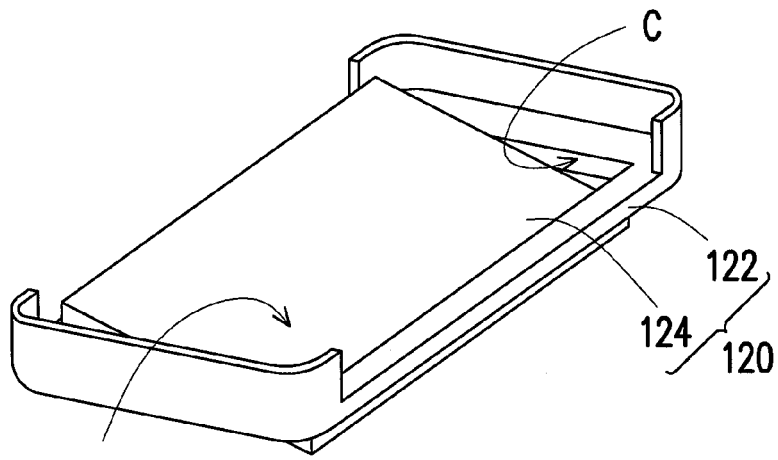
Figure 3C:
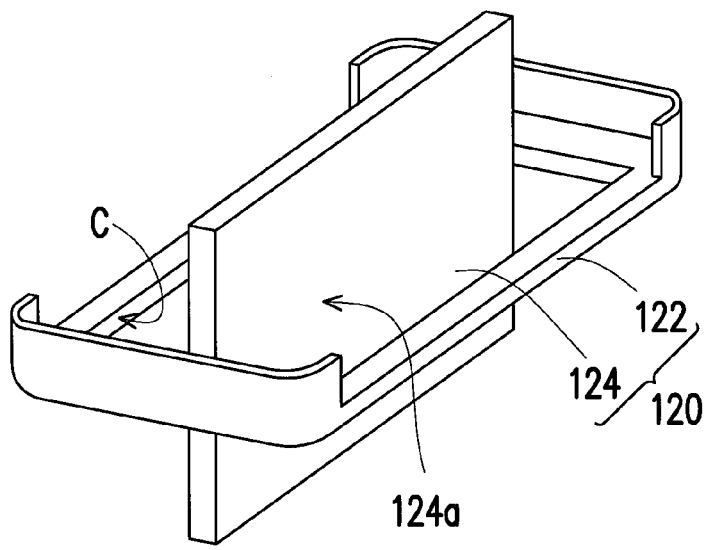
Figure 3D:
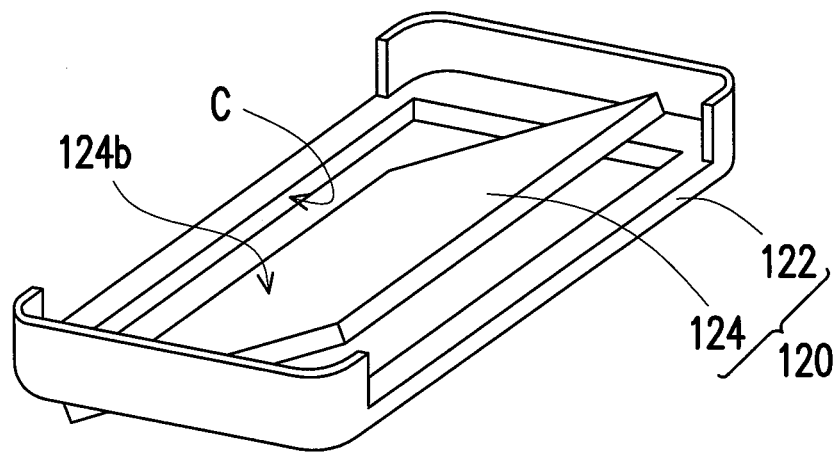
Figure 3E:
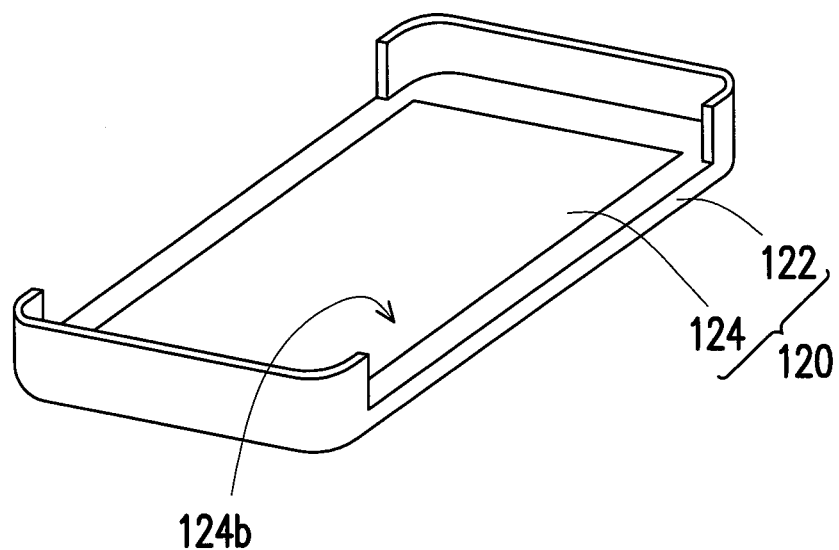

FIG. 3A to FIG. 3E illustrates a flow of an operation process of the thermoelectric conversion module of FIG. 1. The thermoelectric conversion element 124 is suitable to rotate with respect to the shell 122 as shown in FIG. 3A to FIG. 3E between the first state as shown in FIG. 3A and the second state as shown in FIG. 3E. When the thermoelectric conversion element 124 is in the first state, the operation surface 124a faces and contacts the main body 110 shown in FIG. 1 and FIG. 2 and receives heat from the heat generating element 112 for the thermoelectric conversion element 124 to produce electricity. When the thermoelectric conversion element 124 is in the second state, the back surface 124b faces the main body 110 shown in FIG. 1 and FIG. 2 and the operation surface 124a faces the external environment and receives heat from the external environment for the thermoelectric conversion element 124 to produce electricity.

By the above arrangement and operation method, when an user operates the electronic device 100 such that the heat generating element 112 inside the main body 110 of the electronic device 100 generates heat, the operation surface 124a of the thermoelectric conversion element 124 may be faced towards the main body 110 of the electronic device 100, to allow the heat generated by the heat generating element 112 to be transmitted to the operation surface 124a for the thermoelectric conversion element 124 to perform thermoelectric conversion to generate electricity. On the other hand, when a user is not operating the electronic device 100, the operation surface 124a of the thermoelectric conversion element 124 may be faced towards the external environment, to allow the heat of the external environment (for example, heat generated by the body heat of a user or lighting) to be transmitted to the operation surface 124a for the thermoelectric conversion element 124 to perform thermoelectric conversion to produce electricity. Accordingly, the thermoelectric conversion module 120 of the electronic device 100 is able to perform thermoelectric conversion to generate electricity under the situations where a user is operating the electronic device 100 and not operating the electronic device 100 respectively, supplying electricity to the main body 110 of the electronic device 100 and enhancing the endurance of the electronic device 100.

Figure 4:
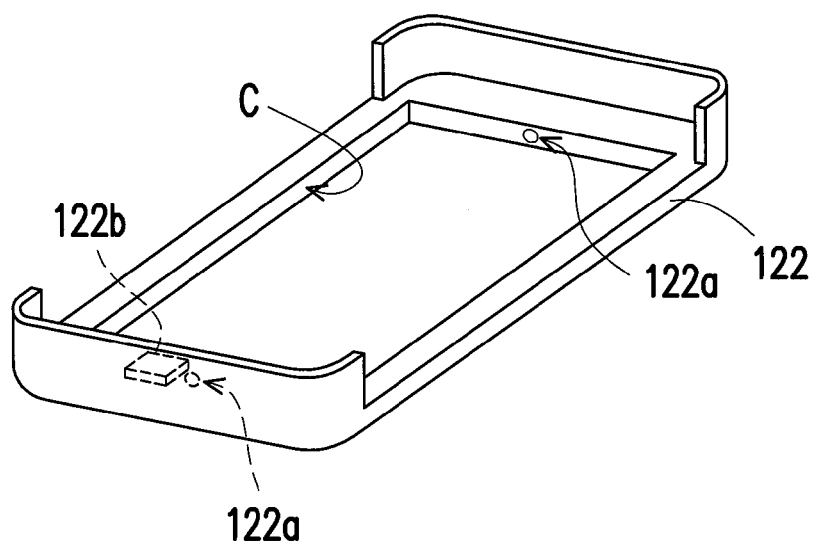
FIG. 4 is a three dimensional view of the shell of FIG. 1.
Figure 5:
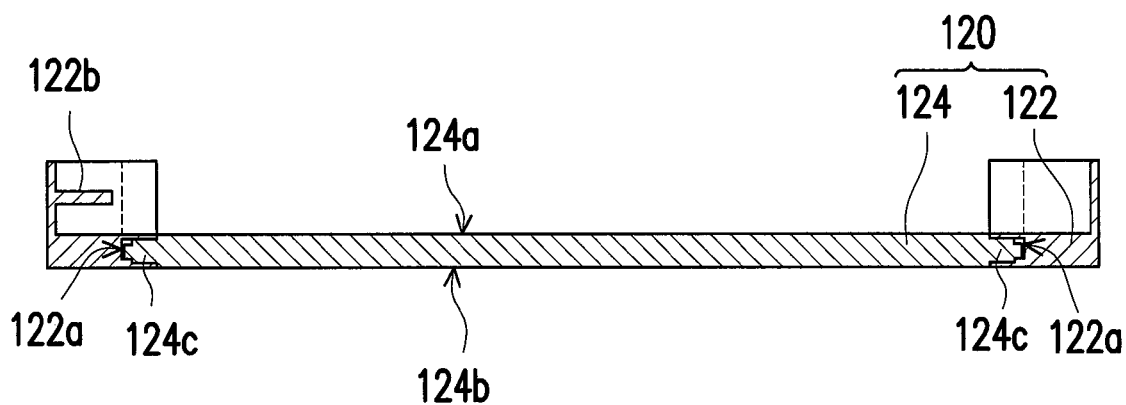
FIG. 5 is a schematic cross-sectional view of the thermoelectric conversion module of FIG. 1.

FIG. 4 is a three dimensional view of the shell of FIG. 1. FIG. 5 is a schematic cross-sectional view of the thermoelectric conversion module of FIG. 1. Referring to FIG. 4 and FIG. 5, the shell 122 of the present embodiment has an accommodating opening C. When the thermoelectric conversion element 124 is in the first state as shown in FIG. 3A or the second state as shown in FIG. 3E, the thermoelectric conversion element 124 is accommodated in the accommodating opening C of the shell 122 and jointly covers the main body 110 of the electronic device 100 with the shell 122. In addition, the shell 122 of the present embodiment has two axial holes 122a opposite to each other, and the thermoelectric conversion element 124 has two shafts 124c opposite to each other, and the two shafts 124c are respectively pivoted at the two axial holes 122a, such that the thermoelectric conversion element 124 may rotate with respect to the shell 122 as shown in FIG. 3A to FIG. 3E. In other embodiments, the shell 122 and the thermoelectric conversion element 124 may be mutually pivoted by other suitable methods, and should not be construed as a limitation to the invention.

As shown in FIG. 4 and FIG. 5, the shell 122 of the present embodiment has an electrical connection portion 122b, and the electrical connection portion 122b, for example, is an electrical adapter and is electrically connected to the thermoelectric conversion element 124. As shown in FIG. 1, when a user assembles the thermoelectric conversion module 120 with the main body 110 of the electronic device 100, the electrical connection portion 122b of the shell 122 is suitable to be plugged into the main body 110, such that the thermoelectric conversion element electrically connects with the main body 110 via the electrical connection portion 122b, for the electrical connection portion 122b to charge the main body 110.

The thermoelectric conversion element 124 of the present embodiment, for example, is electrically connected to the shell 122 via an electric cable (not shown), and the rotation range of the thermoelectric conversion element 124 relative to the shell 122 may be restricted, to prevent excessive rotation ranges of the thermoelectric conversion element 124 relative to the shell 122 which causes the electric cable to be damaged, and a method for restricting the rotation range of the thermoelectric conversion element 124 relative to the shell 122 of the present embodiment is described below accompanied by drawings.

Figure 6:
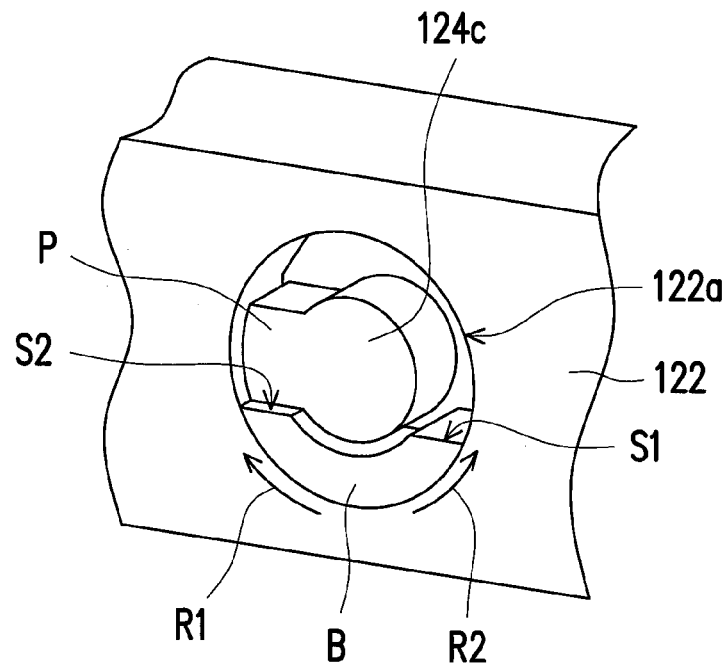
FIG. 6 illustrates a local structure of the thermoelectric conversion module of FIG. 3A at the part of the shaft and the axial hole.
Figure 7:
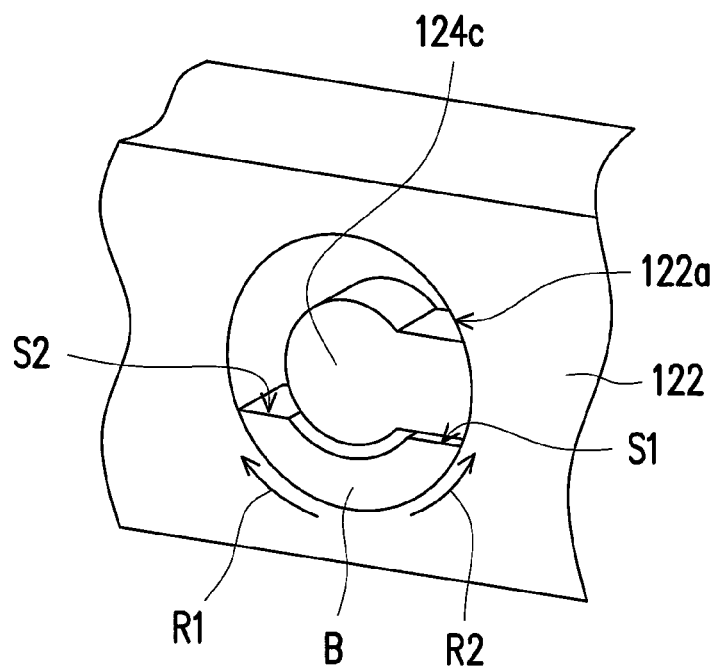
FIG. 7 illustrates a local structure of the thermoelectric conversion module of FIG. 3E at the part of the shaft and the axial hole.

FIG. 6 illustrates a local structure of the thermoelectric conversion module of FIG. 3A at the part of the shaft and the axial hole. FIG. 7 illustrates a local structure of the thermoelectric conversion module of FIG. 3E at the part of the shaft and the axial hole. Referring to FIG. 6 and FIG. 7, in the present embodiment, each of the axial holes 122a has a stop structure B therein, each of the shafts 124c has a protruding portion P, and the stop structure B is adapted to stop the protruding portion P of the shafts 124c to restrict the rotation range of the thermoelectric conversion element 124 (shown in FIG. 2). More specifically, the stop structure B has a first stop surface S1 and a second stop surface S2. When the thermoelectric conversion element 124 rotates from the first state as shown in FIG. 3A along a first rotation direction R1 (labelled in FIG. 6 and FIG. 7) to the second state as shown in FIG. 3E, the first stop surface S1 will stop the protruding portion P of the shafts 124c as shown in FIG. 7 to prevent the thermoelectric conversion element 124 from continuing to rotate along the first rotation direction R1. Similarly, when the thermoelectric conversion element 124 rotates from the second state as shown in FIG. 3E along a second rotation direction R2 opposite of the first rotation direction R1 (labelled in FIG. 6 and FIG. 7) to the first state as shown in FIG. 3A, the second stop surface S2 will stop the protruding portion P of the shafts 124c as shown in FIG. 7 to prevent the thermoelectric conversion element 124 from continuing to rotate along the second rotation direction R2.

As shown in FIG. 6 and FIG. 7, the first stop surface S1 and the second stop surface S2 of the present embodiment are designed to be coplanar, and the rotation range of the thermoelectric conversion element 124 relative to the shell 122 is 180 degrees. In other embodiments, the rotation range of the thermoelectric conversion element 124 relative to the shell 122 may be restricted by other suitable structures, and the relative rotation range may be restricted to other suitable rotation angles, and should not be construed as a limitation to the invention.

Figure 8:
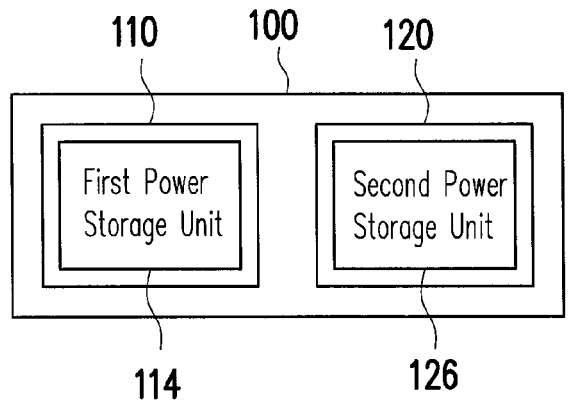
FIG. 8 is a block diagram illustrating partial components of the electronic device of FIG. 1.

FIG. 8 is a block diagram illustrating partial components of the electronic device of FIG. 1. Referring to FIG. 8, in the electronic device 100 of the present embodiment, the main body 110 has a first power storage unit 114, and the thermoelectric conversion module 120 has a second power storage unit 126. The electricity generated by the thermoelectric conversion element 124 (shown in FIG. 2) may be provided directly to the first power storage unit 114 of the main body 110, and the electricity also may be first stored to the second power storage unit 126 of the thermoelectric conversion module 120, and then supplied to the first power storage unit 114 from the second power storage unit 126.

Figure 9:
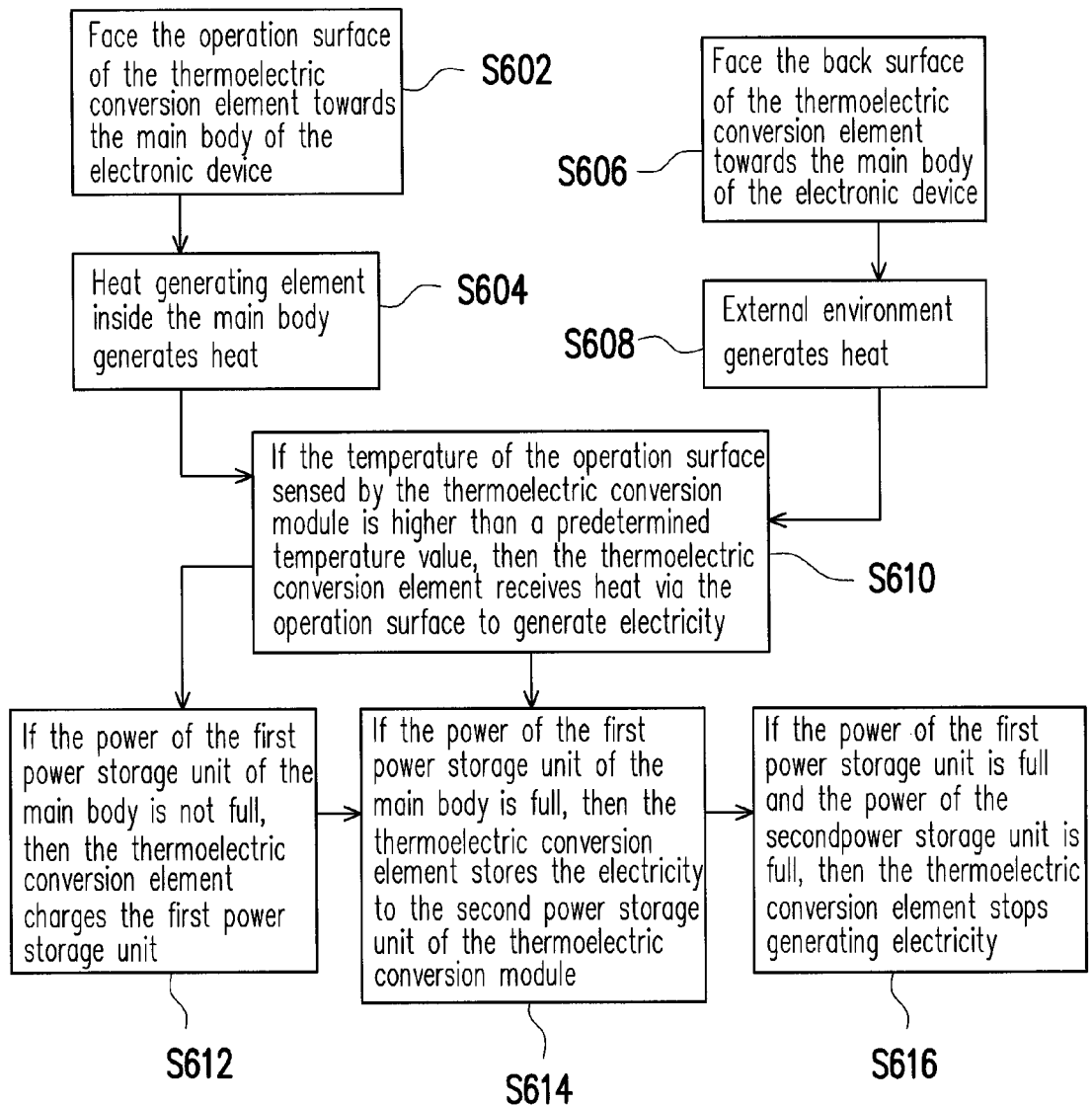
FIG. 9 is a flow diagram illustrating the operations of the thermoelectric conversion module of FIG. 1.

The operation of the thermoelectric conversion module 120 of the present embodiment is described below. FIG. 9 is a flow diagram illustrating the operations of the thermoelectric conversion module of FIG. 1. Referring to FIG. 1 to FIG. 3 and FIG. 9, an user may face the operation surface 124a of the thermoelectric conversion element 124 towards the main body 110 of the electronic device 100 (step S602), and here, the heat generating element 112 inside the main body 110 generates heat (step S604) and transmits the heat to the operation surface 124a of the thermoelectric conversion element 124. Then, if the temperature of the operation surface 124a sensed by the thermoelectric conversion module 120 is higher than a predetermined temperature value, then the thermoelectric conversion element 124 receives heat via the operation surface 124a to generate electricity (step S610). On the other hand, if the temperature of the operation surface 124a sensed by the thermoelectric conversion module 120 is lower than the predetermined temperature value, then the thermoelectric conversion element 124 stops generating electricity. The thermoelectric conversion module 120, for example, has a temperature sensing element to sense the temperature of the operation surface 124a, however the type of temperature sensing element should not be construed as a limitation to the invention. In addition, the predetermined temperature value, for example, is 34 degrees Celsius or other suitable temperature values, and should not be construed as a limitation to the invention.

On the other hand, an user may face the back surface 124b of the thermoelectric conversion element 124 towards the main body 110 of the electronic device 100 (step S606) such that the operation surface 124a of the thermoelectric conversion element 124 faces the external environment, and here, the external environment generates heat (step S608) and transmits the heat to the operation surface 124a of the thermoelectric conversion element 124, wherein the heat generated by the external environment, for example, is from the hand of a user, a pocket of a user, a dashboard of a car, sunlight or other heat sources of the external environment. Then, if the temperature of the operation surface 124a sensed by the thermoelectric conversion module 120 is higher than a predetermined temperature value, then the thermoelectric conversion element 124 receives heat via the operation surface 124a to generate electricity (step S610). On the other hand, if the temperature of the operation surface 124a sensed by the thermoelectric conversion module 120 is lower than a predetermined temperature value, then the thermoelectric conversion element 124 stops generating electricity. The predetermined temperature value, for example, is 34 degrees Celsius or other suitable temperature values, and should not be construed as a limitation to the invention.

After the thermoelectric conversion element 124 as in step S610 generates electricity via the heat received by the operation surface 124a, if the power of the first power storage unit 114 of the main body 110 is not full, then the thermoelectric conversion element 124 charges the first power storage unit 114 (step S612). If the power of the first power storage unit 114 of the main body is full, then the thermoelectric conversion element 124 stores the electricity to the second power storage unit 126 of the thermoelectric conversion module 120 (step S614), and waits for the power of the first power storage unit 114 to drain, and then supplies power to the first power storage unit 114 from the second power storage unit 126. In addition, if the power of the first power storage unit 114 is full and the power of the second power storage unit 126 is full, then the thermoelectric conversion element 124 stops generating electricity (step S616).

The connection method of the thermoelectric conversion element and the shell should not be construed as a limitation to the invention, and is described below accompanied by drawings.

Figure 10:
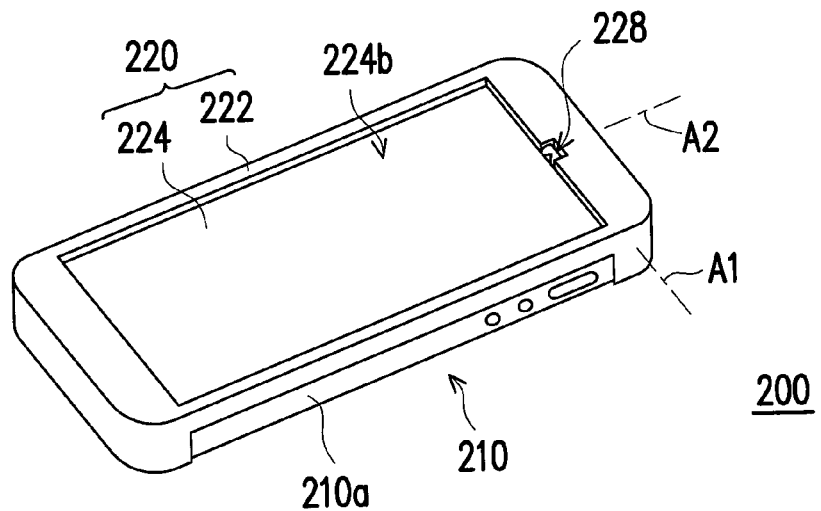
FIG. 10 is a three dimensional view illustrating an electronic device according to another embodiment of the invention.

FIG. 10 is a three dimensional view illustrating an electronic device according to another embodiment of the invention. In an electronic device 200 of FIG. 10, an operation method of a main body 210 and a thermoelectric conversion module 220 is similar to the operation method of the main body 110 and the thermoelectric conversion module 120 of FIG. 1, and will not be repeated here. The difference of the electronic device 200 and the electronic device 100 lies in the connection method of the shell 222 and the thermoelectric conversion element 224, and is described below.

Figure 11:
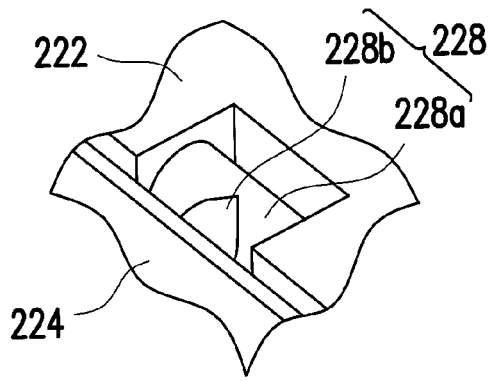
FIG. 11 is a partial exploded view of the electronic device of FIG. 10.
Figure 12:
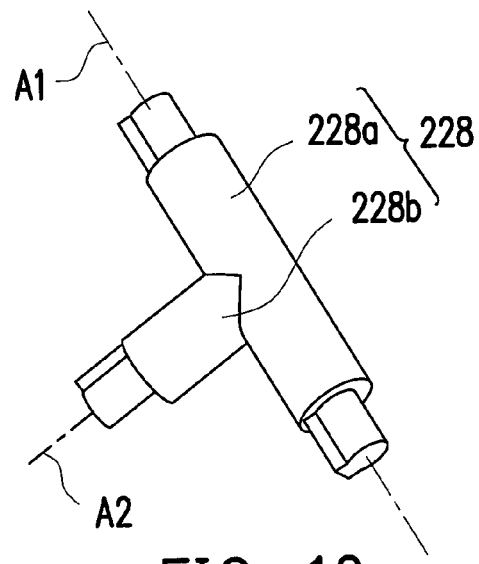
FIG. 12 is a three dimensional view of the pivoting component of FIG. 11.

FIG. 11 is a partial exploded view of the electronic device of FIG. 10. FIG. 12 is a three dimensional view of the pivoting component of FIG. 11. Referring to FIG. 10 to FIG. 12, the thermoelectric conversion module 220 includes a pivoting component 228, and the pivoting component 228 is pivoted on the shell 222 along a first axis A1 by a first axial part 228a thereof, and the thermoelectric conversion element 224 is pivoted on a second axial part 228b of the pivoting component 228 along a second axis A2 vertical to the first axis A1.

Figure 13A:
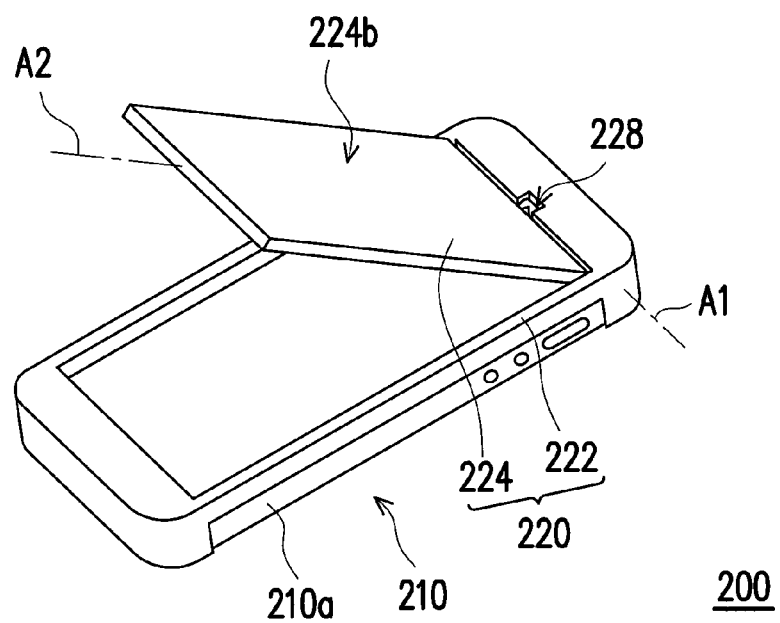
FIG. 13A to FIG. 13F illustrates a flow of an operation process of the thermoelectric conversion module of FIG. 10.
Figure 13B:
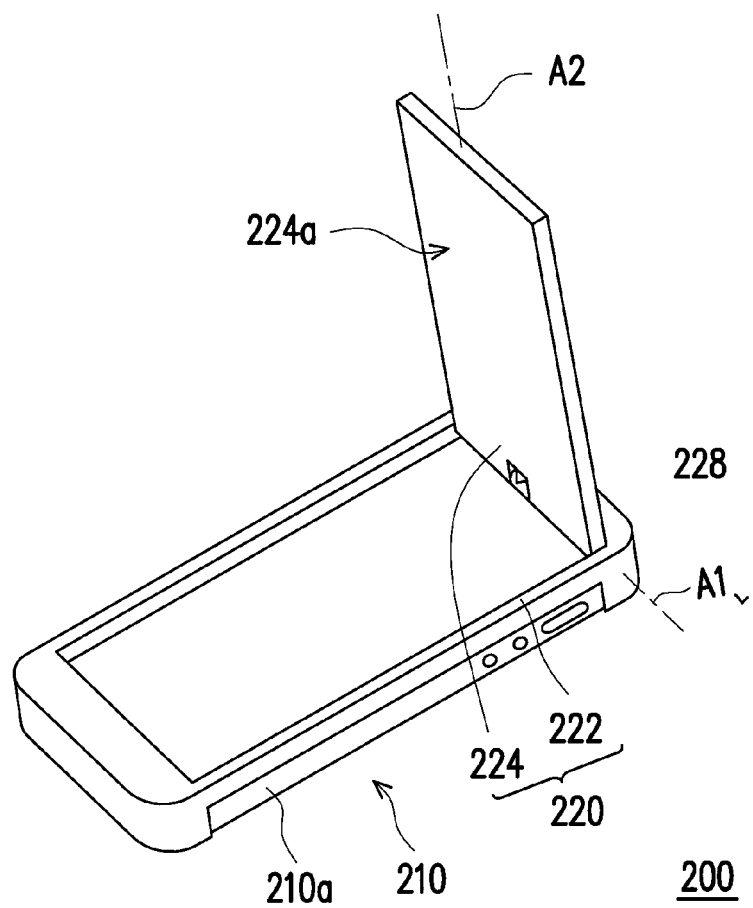
Figure 13C:
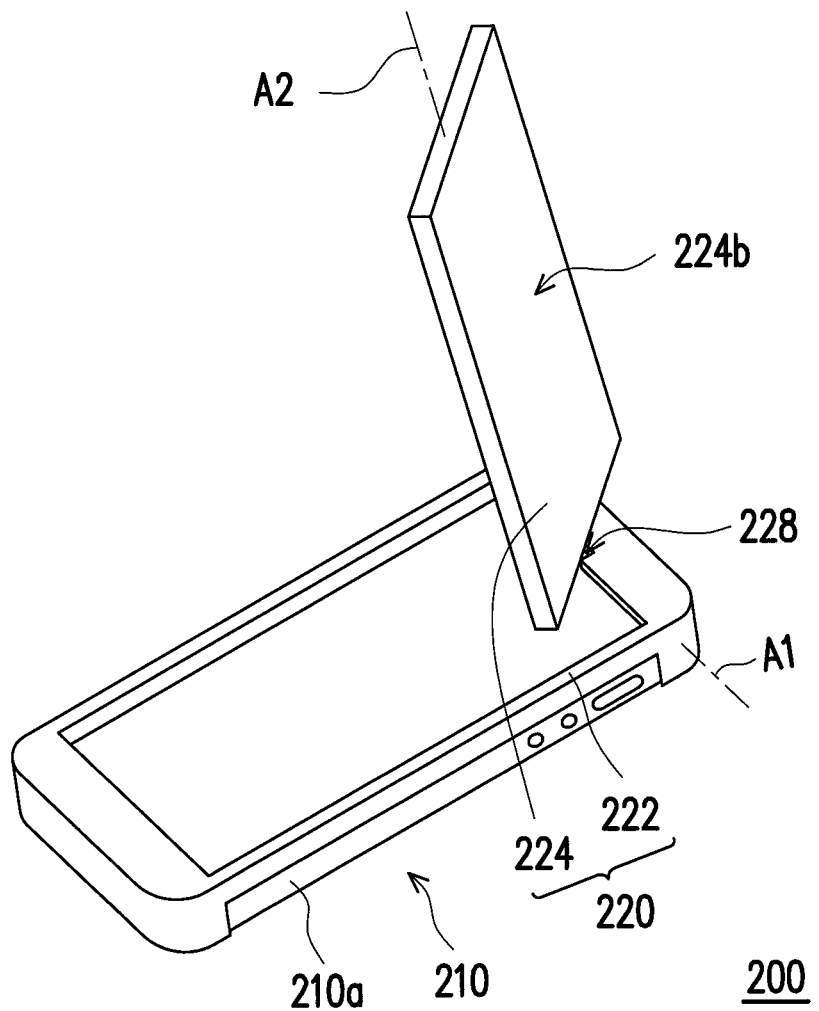
Figure 13D:
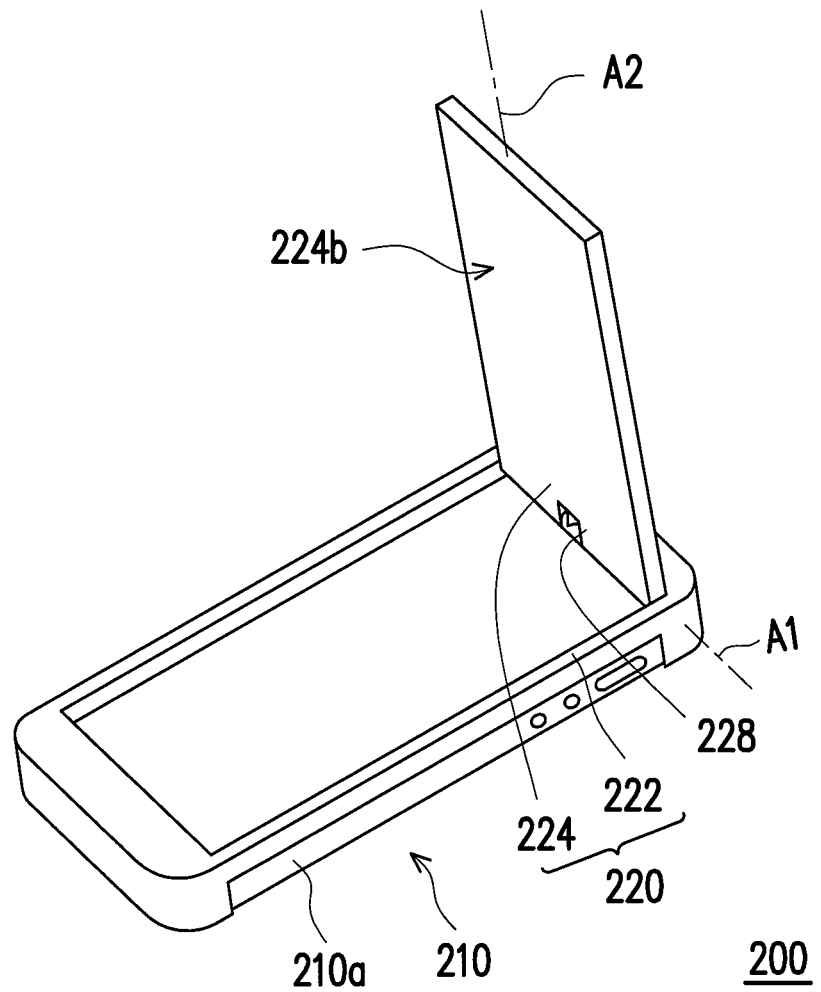
Figure 13E:
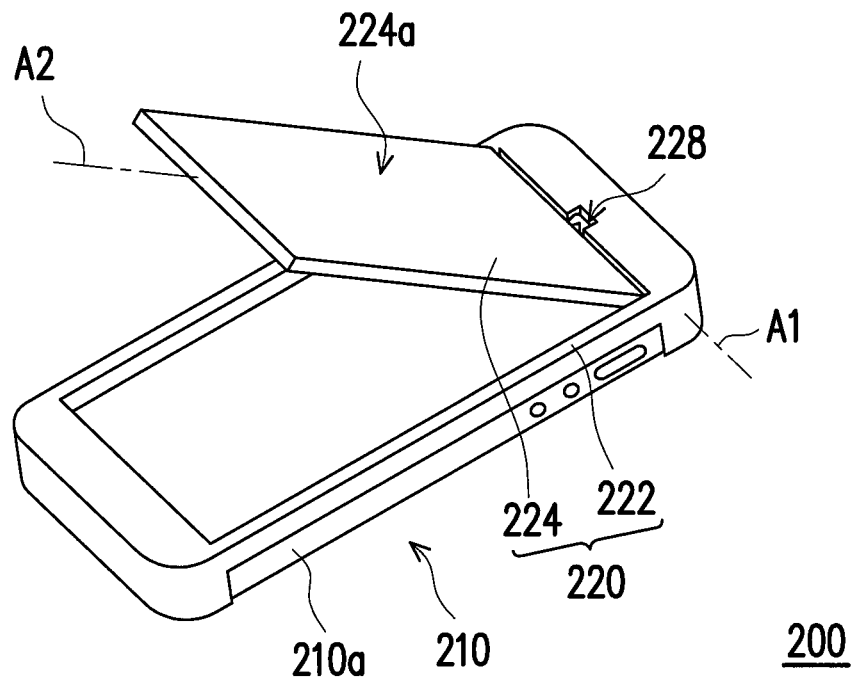
Figure 13F:
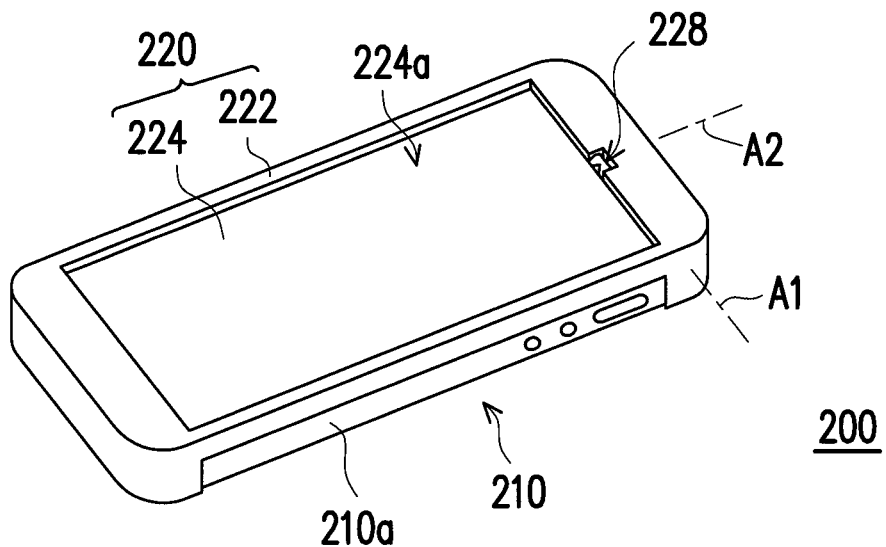

FIG. 13A to FIG. 13F illustrates a flow of an operation process of the thermoelectric conversion module of FIG. 10. The thermoelectric conversion element 224 of FIG. 10 is adapted to expand from the shell 222 as shown in FIG. 13A to FIG. 13B via the rotation of the pivoting component 228 relative to the shell 222 along the first axis A1. When the thermoelectric conversion element 224 expands from the shell 222 as shown in FIG. 13B, the thermoelectric conversion element 224 is adapted to rotate relative to the pivoting component 228 along the second axis A2 as shown in FIG. 13C to FIG. 13D, to change the direction the operation surface 224a faces. The thermoelectric conversion element 224 shown in FIG. 13D is suitable to close to the body 210 as shown in FIG. 13E to FIG. 13F via the rotation of the pivoting component 228 relative to the shell 222 along the first axis A1. By the above operating process, the operation surface 224a may be faced towards the main body 210 (the state shown in FIG. 10) to receive heat of the main body 210 to generate electricity, or the back surface 224b may be faced towards the main body 210 and the operation surface 124a faced towards the external environment (the state shown in FIG. 13F) to receive heat of the external environment to generate electricity.

As shown in FIG. 6 and FIG. 7, similar with restricting the rotation range of the thermoelectric conversion element 124 relative to the shell 122 by the interference of the stop structure B and the protruding portion P, the rotation range of the pivoting component 228 relative to the thermoelectric conversion element 224 as shown in FIG. 11 may also be restricted according to the same method or other suitable methods, and should not be construed as a limitation to the invention.

Similar to the shell 122 shown in FIG. 1 is a protection cover suitable for the main body 110, the shell 222 shown in FIG. 10 is also, for example, a protection cover suitable for the main body 210 and detachably assembled to the casing 210a of the main body 210. However, in other embodiments, the shell 222 may be the casing of the main body 210, and should not be construed as a limitation to the invention.

Figure 14:
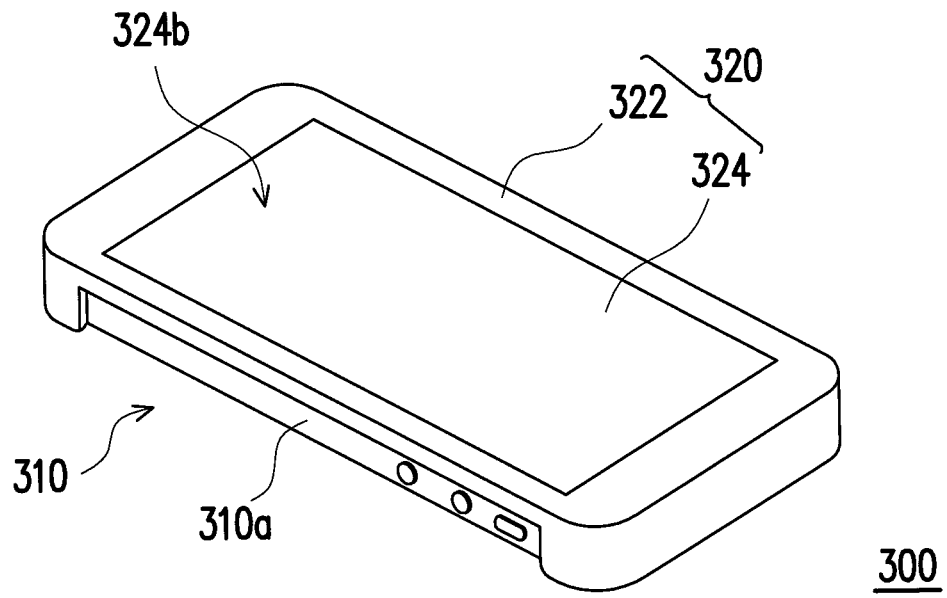
FIG. 14 is a three dimensional view illustrating an electronic device according to another embodiment of the invention.

FIG. 14 is a three dimensional view illustrating an electronic device according to another embodiment of the invention. In an electronic device 300 of FIG. 14, an operation method of a main body 310 and a thermoelectric conversion module 320 is similar to the operation method of the main body 110 and the thermoelectric conversion module 120 of FIG. 1, and will not be repeated here. The difference of the electronic device 300 and the electronic device 100 lies in the connection method of the shell 322 and the thermoelectric conversion element 324, and is described below.

Figure 15A:
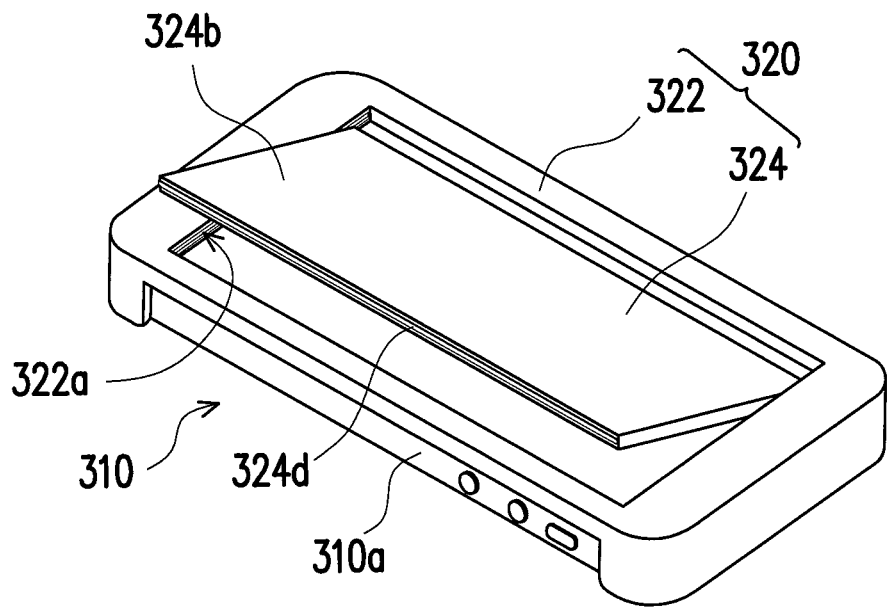
FIG. 15A to FIG. 15D illustrates a flow of an operation process of the thermoelectric conversion module of FIG. 14.
Figure 15B:
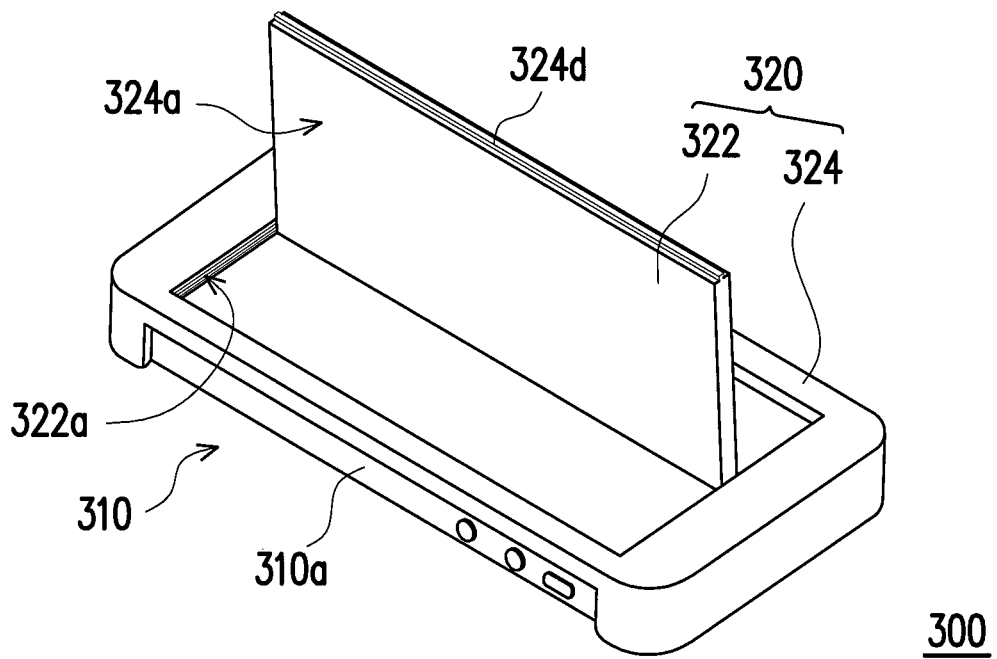
Figure 15C:
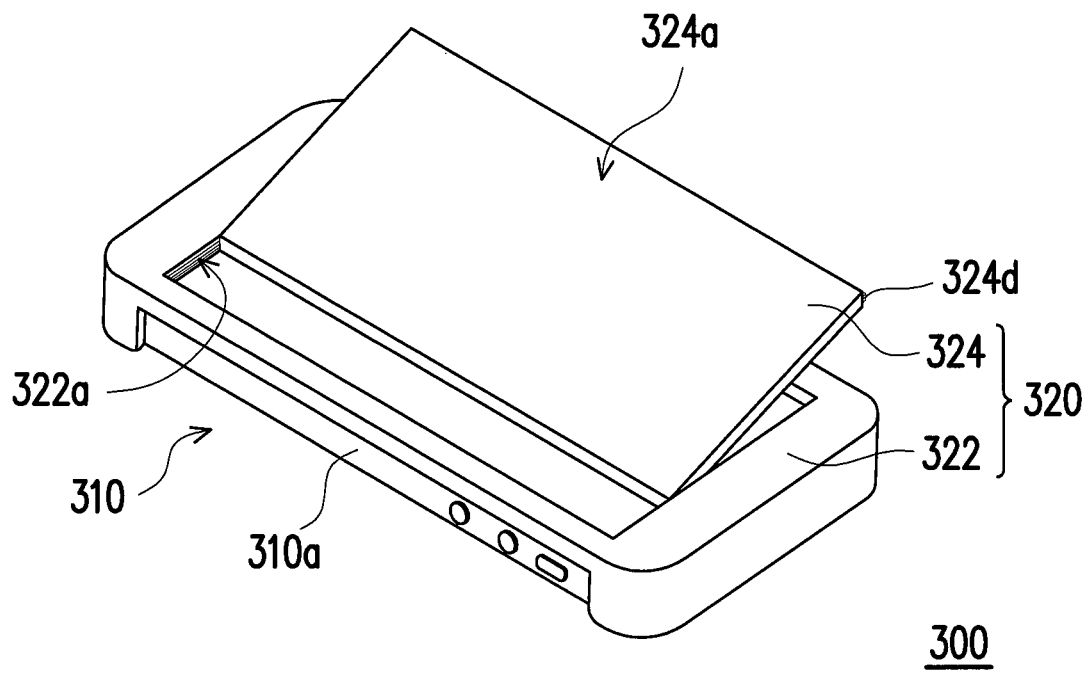
Figure 15D:
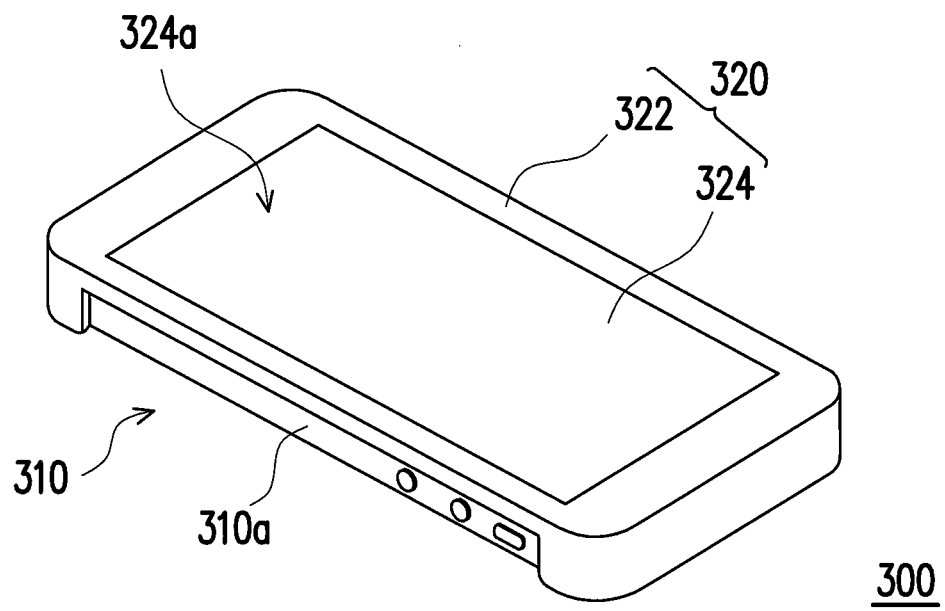
Figure 16:
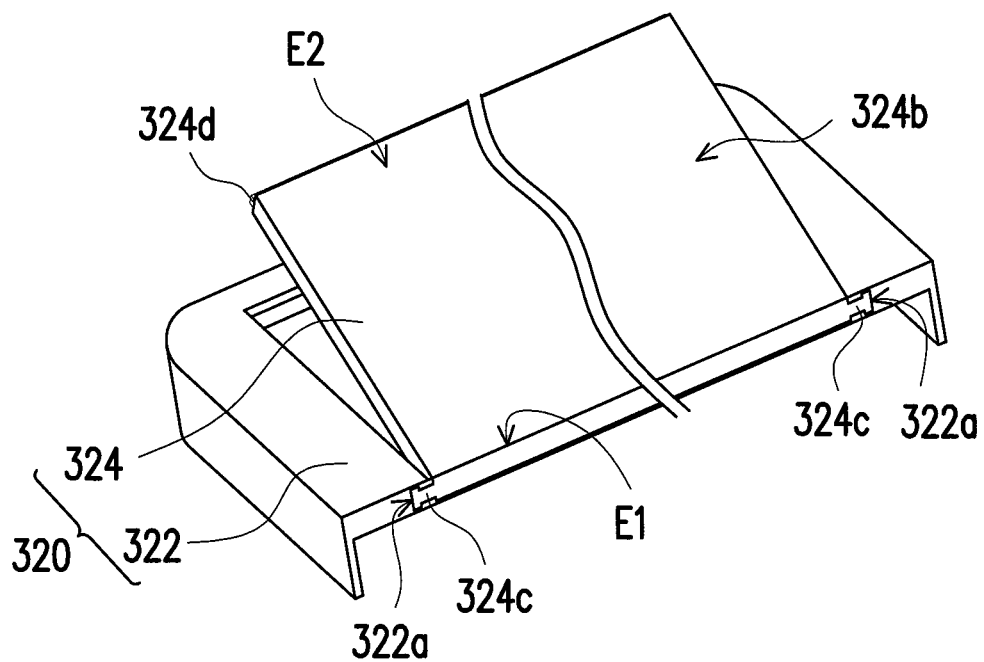
FIG. 16 is a partial three dimensional view of the structure of FIG. 15A.

FIG. 15A to FIG. 15D illustrates a flow of an operation process of the thermoelectric conversion module of FIG. 14. FIG. 16 is a partial three dimensional view of the structure of FIG. 15A. Referring to FIG. 15A and FIG. 16A, the shell 322 has two sliding grooves 322a opposite to each other, and the thermoelectric conversion element 324 has two shafts 324c opposite to each other, and the shafts 324c are slidably disposed at the two sliding grooves 322a. The thermoelectric conversion element 324 shown in FIG. 14 is adapted to rotate relative to the shell 322 to expand the shell 322 via the two shafts 324c as shown in FIG. 15A. When the thermoelectric conversion element 324 expands from the shell 322 as shown in FIG. 15A, the thermoelectric conversion element 324 is adapted to slide along the sliding grooves 322a via by the shafts 324c as shown in FIG. 15B to FIG. 15C, and in the sliding process of the thermoelectric conversion element 324 as shown in FIG. 15B to FIG. 15C, the thermoelectric conversion element 324 may also at the same time rotate relative to the shell 322 via the two shafts 324c, until the thermoelectric conversion element 324 closes to the shell 322 as shown in FIG. 15D. By the above operation method, the operation surface 324a may be faced towards the main body 310 (the state shown in FIG. 14) to receive heat of the main body 310 to generate electricity, or the back surface 324b may be faced towards the main body 310 and the operation surface 324a faced towards the external environment (the state shown in FIG. 15D) to receive heat of the external environment to generate electricity.

Figure 17:
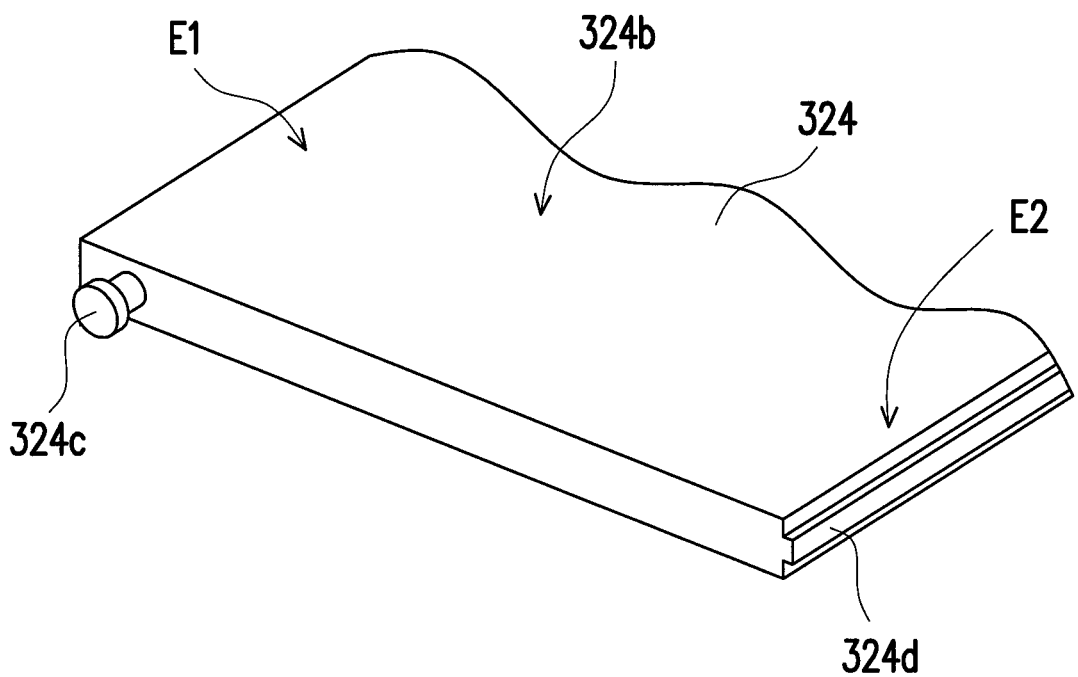
FIG. 17 is a partial three dimensional view of the thermoelectric conversion element of FIG. 14.

FIG. 17 is a partial three dimensional view of the thermoelectric conversion element 324 of FIG. 14. Referring to FIG. 16 and FIG. 17, the thermoelectric conversion element 324 of the present embodiment has a connecting end E1 and a free end E2 opposite to each other, and the connecting end E1 is connected to the two sliding grooves 322a by the two shafts 324c, and the free end E2 has a positioning structure 324d. The positioning structure 324d, for example, is formed at the flange of the free end E2. When the thermoelectric conversion element 324 closes to the shell 322 as shown in FIG. 14, the free edge E2 is adapted to be positioned at the shell 322 by interference of the positioning structure 324d and the shell 322.

As shown in FIG. 1, similar with the shell 122 is a protection cover suitable for the main body 110, the shell 322 shown in FIG. 14 is also, for example, a protection cover suitable for the main body 310 and is detachably assembled to the casing 310a of the main body 310. However, in other embodiments, the shell 322 may be the casing of the main body 310, and should not be construed as a limitation to the invention.

In summary, the electronic device of the invention has a thermoelectric conversion module, and the thermoelectric conversion element of the thermoelectric conversion module may rotate relative to the shell, such that the operation surface of the thermoelectric conversion element faces towards the main body of the electronic device or faces towards the external environment. When an user operates the electronic device such that the heat generating element inside the main body of the electronic device generates heat, the operation surface of the thermoelectric conversion element may be faced towards the main body of the electronic device, to allow the heat generated by the heat generating element to be transmitted to the operation surface for the thermoelectric conversion element to perform thermoelectric conversion to generate electricity. On the other hand, when a user is not operating the electronic device, the operation surface of the thermoelectric conversion element may be faced towards the external environment, to allow the heat of the external environment (for example, heat generated by the body heat of a user or lighting) to be transmitted to the operation surface for the thermoelectric conversion element to perform thermoelectric conversion to produce electricity. Accordingly, the thermoelectric conversion module of the electronic device is able to perform thermoelectric conversion to generate electricity under the situations where a user is operating the electronic device and not operating the electronic device respectively, supplying electricity to the main body of the electronic device and enhancing the endurance of the electronic device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electronic device, comprising:
   a main body, having at least one heat generating element therein; and
   a thermoelectric conversion module, comprising:
   a shell, assembled to the main body; and
   a thermoelectric conversion element, pivoted on the shell and has an operation surface and a back surface opposite to each other, wherein the thermoelectric conversion element is adapted to rotate between a first state and a second state relative to the shell, when the thermoelectric conversion element is in the first state, the operation surface faces the main body and receives heat from the heat generating element, for the thermoelectric conversion element to generate electricity, and when the thermoelectric conversion element is in the second state, the back surface faces the main body and the operation surface receives heat from the external environment, for the thermoelectric conversion element to generate electricity.

2. The electronic device as claimed in claim 1, wherein the shell has an electrical connection portion, and the thermoelectric conversion element is electrically connected with the main body via the electrical connection portion, such that the electrical connection portion charges the main body.

3. The electronic device as claimed in claim 1, wherein the shell has at least one axial hole, the thermoelectric conversion element has at least one shaft and is pivoted on the axial hole by the shaft, the axial hole has a stop structure therein, the shaft has a protruding portion, and the stop structure is adapted to stop the protruding portion to restrict a rotation range of the thermoelectric conversion element.

4. The electronic device as claimed in claim 3, wherein the stop structure has a first stop surface and a second stop surface, when the thermoelectric conversion element rotates to the second state from the first state along a first rotation direction, the first stop surface stops the protruding portion to prevent the thermoelectric conversion element from continuing to rotate along the first rotation direction, and when the thermoelectric conversion element rotates to the first state from the second state along a second rotation direction opposite to the first rotation direction, the second stop surface stops the protruding portion to prevent the thermoelectric conversion element from continuing to rotate along the second rotation direction.

5. The electronic device as claimed in claim 4, wherein the first stop surface and the second stop surface are coplanar.

6. The electronic device as claimed in claim 1, wherein the shell has a accommodating opening, and when the thermoelectric conversion element is in the first state or the second state, the thermoelectric conversion element is accommodated in the accommodating opening.

7. The electronic device as claimed in claim 1, wherein the shell has two axial holes opposite to each other, the thermoelectric conversion element has two shafts opposite to each other, and the two shafts are respectively pivoted at the two axial holes.

8. The electronic device as claimed in claim 1, wherein the thermoelectric conversion module comprises a pivoting component, the pivoting component is pivoted on the shell along a first axis, and the thermoelectric conversion element is pivoted on the pivoting component along a second axis.

9. The electronic device as claimed in claim 8, wherein the thermoelectric conversion element is adapted to rotate relatively to the shell along the first axis via the pivoting component to expand from or close to the shell, and when the thermoelectric conversion element expands from the shell, the thermoelectric conversion element is adapted to rotate relatively to the pivoting component along the second axis.

10. The electronic device as claimed in claim 1, wherein the shell has two sliding grooves opposite to each other, the thermoelectric conversion element has two shafts opposite to each other, and the two shafts are slidably disposed respectively at the two sliding grooves.

11. The electronic device as claimed in claim 10, wherein the thermoelectric conversion element is adapted to rotate relatively to the shell via the two shafts to expand from or close to the shell, and when the thermoelectric conversion element expands from the shell, the thermoelectric conversion element is adapted to slide along each of the sliding grooves via each of the shafts.

12. The electronic device as claimed in claim 10, wherein the thermoelectric conversion element has a connecting end and a free end opposite to each other, the connecting end is connected to the two sliding grooves by the two shafts, and the free end has a positioning structure and is adapted to be positioned at the shell by the positioning structure.

13. The electronic device as claimed in claim 1, wherein when a temperature of the operation surface sensed by the thermoelectric conversion module is higher than a predetermined temperature value, the thermoelectric conversion element generates electricity by a heat received by the operation surface, and when the temperature of the operation surface sensed by the thermoelectric conversion module is lower than the predetermined temperature value, the thermoelectric conversion element stops generating electricity.

14. The electronic device as claimed in claim 1, wherein the main body has a first power storage unit, and when a power of the first power storage unit is not full, the thermoelectric conversion element charges the first power storage unit.

15. The electronic device as claimed in claim 14, wherein the thermoelectric conversion module has a second power storage unit, and when the power of the first power storage unit is full, the thermoelectric conversion element stores electricity to the second power storage unit.

16. The electronic device as claimed in claim 15, wherein when the power of the first power storage unit is full and the power of the second power storage unit is full, the thermoelectric conversion element stops generating electricity.

17. The electronic device as claimed in claim 1, wherein the main body has a casing, and the shell is a protection cover and detachably assembled to the casing.

* * * * *